(12) United States Patent
Kim (10) Patent No.: US 7,749,827 B2
(45) Date of Patent: Jul. 6, 2010

(54) THIN FILM TRANSISTOR (TFT) AND FLAT PANEL DISPLAY INCLUDING THE TFT AND THEIR METHODS OF MANUFACTURE

(75) Inventor: Tae-Seong Kim, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 0 days.

(21) Appl. No.: 12/216,424

(22) Filed: Jul. 3, 2008

(65) Prior Publication Data

US 2008/0299713 A1 Dec. 4, 2008

Related U.S. Application Data

(63) Continuation of application No. 11/169,301, filed on Jun. 29, 2005, now abandoned.

(30) Foreign Application Priority Data

Jun. 30, 2004 (KR) .................. 10-2004-0050421

(51) Int. Cl.
*H01L 21/00* (2006.01)
*H01L 21/84* (2006.01)
(52) U.S. Cl. ....................... 438/166; 438/149
(58) Field of Classification Search .......... 438/149, 438/166
See application file for complete search history.

(56) References Cited

U.S. PATENT DOCUMENTS

| 5,981,973 | A | 11/1999 | Matsuzaki et al. |
| 6,093,934 | A | 7/2000 | Yamazaki et al. |
| 6,255,706 | B1 | 7/2001 | Watanabe et al. |
| 6,268,631 | B1 * | 7/2001 | Fukada et al. ............... 257/347 |
| 6,630,687 | B1 | 10/2003 | Koyama et al. |
| 6,744,069 | B1 | 6/2004 | Yamazaki et al. |
| 6,790,714 | B2 * | 9/2004 | Hirano et al. ............... 438/149 |
| 6,798,132 | B2 | 9/2004 | Satake |
| 2001/0025958 | A1 * | 10/2001 | Yamazaki et al. ............. 257/72 |
| 2002/0019081 | A1 * | 2/2002 | Denis et al. ................. 438/149 |

(Continued)

FOREIGN PATENT DOCUMENTS

JP 3-12637 1/1991

(Continued)

OTHER PUBLICATIONS

Machine Translation of KR 10-2000-0057733.*

(Continued)

*Primary Examiner*—Kenneth A Parker
*Assistant Examiner*—Anthony Ho
(74) *Attorney, Agent, or Firm*—Robert E. Bushnell, Esq.

(57) ABSTRACT

A Thin Film Transistor (TFT) reduces interconnection resistance of source/drain electrodes, prevents contamination from an active layer, reduces contact resistance between a pixel electrode and the source/drain electrodes, smoothly supplies hydrogen to the active layer and has high mobility, on-current characteristics, and threshold voltage characteristics The TFT includes an active layer having a channel region and source/drain regions, a gate electrode supplying a signal to the channel region, source/drain electrodes respectively connected to the source/drain regions and including at least one of Ti, a Ti alloy, Ta, and a Ta alloy; and an insulating layer interposed between the source/drain electrodes and the active layer and including silicon nitride.

3 Claims, 7 Drawing Sheets

U.S. PATENT DOCUMENTS

| | | |
|---|---|---|
| 2003/0116805 A1* | 6/2003 | Suzawa et al. .............. 257/350 |
| 2004/0084675 A1 | 5/2004 | Koyama et al. |
| 2004/0263706 A1 | 12/2004 | Cho et al. |
| 2005/0013927 A1 | 1/2005 | Yamazaki |
| 2005/0056843 A1 | 3/2005 | Yamazaki et al. |
| 2006/0001092 A1 | 1/2006 | Kim |
| 2006/0145148 A1 | 7/2006 | Hirai et al. |

FOREIGN PATENT DOCUMENTS

| | | |
|---|---|---|
| JP | 03-012637 | 1/1991 |
| JP | 2001-281694 | 10/2001 |
| JP | 2002-50633 | 2/2002 |
| JP | 2002-050633 | 2/2002 |
| JP | 2004-172150 | 6/2004 |
| KR | 1020000057733 A * | 9/2000 |

OTHER PUBLICATIONS

Chinese Office Action for corresponding Patent Application No. 200510091311.4, issued on Apr. 25, 2008 (with English translation).
*Office Action* from the Japanese Patent Office issued in Applicant's corresponding Japanese Patent Application No. 2004-350347 dated Jun. 3, 2008.

* cited by examiner

THIN FILM TRANSISTOR (TFT) AND FLAT PANEL DISPLAY INCLUDING THE TFT AND THEIR METHODS OF MANUFACTURE

CROSS-REFERENCE TO RELATED APPLICATIONS

This application is a continuation and divisional of Applicant's Ser. No. 11/169,301 filed in the U.S. Patent & Trademark Office on 29 Jun. 2005 now abandoned, and assigned to the assignee of the present invention. Furthermore, the present application is related to a U.S. application Ser. No. 11/169,329, entitled THIN FILM TRANSISTOR (TFT) AND FLAT PANEL DISPLAY INCLUDING TFT, based upon Korean Patent Application Serial No. 10-2004-0050422 filed in the Korean Intellectual Property Office on 30 Jun. 2004, and filed in the U.S. Patent & Trademark Office concurrently with the present application on 29 Jun. 2005.

CLAIM OF PRIORITY

This application makes reference to, incorporates the same herein, and claims all benefits accruing under 35 U.S.C. §119 from an application entitled TFT, MANUFACTURING METHOD OF THE TFT, FLAT PANEL DISPLAY DEVICE WITH THE TFT, AND MANUFACTURING METHOD OF FLAT PANEL DISPLAY DEVICE filed with the Korean Industrial Property Office on Jun. 30, 2004 and there duly assigned Serial No. 10-2004-0050421.

BACKGROUND OF THE INVENTION

1. Field of the Invention

The present invention relates to a Thin Film Transistor (TFT), a method of manufacturing the TFT, and a flat panel display including the TFT and its method of manufacture. More particularly, the present invention relates to a TFT having an improved structure including an InterLevel Dielectric (ILD) layer and source/drain electrodes, and a method of manufacturing the TFT, and a flat panel display device including the TFT.

2. Description of the Related Art

A flat panel display device such as a liquid crystal display (LCD), an organic light-emitting diode (OLED), or an inorganic light-emitting diode is categorized by driving methods into a passive matrix (PM) flat panel display device using a passive driving method and an active matrix (AM) flat panel display device using an active driving method.

In the PM flat panel display device, anodes and cathodes, respectively, are arranged in a plurality of columns and rows, and a scanning signal is supplied by a row driving circuit to the cathodes. In this case, only one row of the plurality of rows is selected. In addition, a data signal is input by a column driving circuit into each pixel.

The AM flat panel display device is widely used as a display device, which controls a signal input into each pixel using a thin film transistor (TFT) and is adapted to processing of an enormous amount of signals to realize a moving image.

In a TFT of a flat panel display, an active layer comprised of a semiconductor is formed on a substrate. A gate insulating layer is formed on the active layer to cover the active layer. A gate electrode 40 formed on the gate insulating layer. The gate electrode is covered with an InterLevel Dielectric (ILD) layer, and contact holes through which source/drain regions of the active layer are exposed are formed in the gate insulating layer and the ILD layer. Source/drain electrodes are formed on the ILD layer. The source/drain electrodes are connected to the source/drain regions of the active layer through the contact holes. When forming the source/drain electrodes, a variety of signal interconnections of the flat panel display can be formed together.

The source/drain electrodes and the signal interconnections can be formed of molybdenum or molybdenum alloy. Since molybdenum has a high specific resistance, the resistance of the source/drain electrodes and the signal interconnection is increased, resulting in a signal delay in a flat panel display including the TFT. This signal delay causes the lowering of the picture quality of the flat panel display.

In order to solve these problems, the source/drain electrodes and the signal interconnection have been formed of a double layer comprising a molybdenum layer and an aluminum layer having a low resistance formed on the molybdenum layer. However, one of the source/drain electrodes is in contact with an Indium Tin Oxide (ITO) layer of a pixel electrode (not shown). Since an oxide layer is formed between the aluminum layer and the ITO layer, the contact resistance between the pixel electrode and the source/drain electrodes contacting the pixel electrode is increased.

SUMMARY OF THE INVENTION

The present invention provides a thin film transistor (TFT) which reduces interconnection resistance of source/drain electrodes, prevents contamination from an active layer, reduces contact resistance between a pixel electrode and the source/drain electrodes, smoothly supplies hydrogen to the active layer and has high mobility, on-current characteristics, and threshold voltage characteristics, and a flat panel display device having the TFT.

According to one aspect of the present invention, a Thin Film Transistor (TFT) is provided, the TFT comprising: an active layer having a channel region and source/drain regions; a gate electrode adapted to supply a signal to the channel region; source/drain electrodes respectively connected to the source/drain regions and including at least one of Ti, Ti alloy, Ta, and Ta alloy; and an insulating layer interposed between the source/drain electrodes and the active layer and including silicon nitride.

The source/drain electrodes comprise a first metallic layer pattern, a second metallic layer pattern, and a third metallic layer pattern, the metallic layer patterns being sequentially stacked in the direction of the active layer.

The first metallic layer pattern comprises at least one of Cr, a Cr alloy, Mo, and an Mo alloy.

The second metallic layer pattern comprises at least one of Al, AlSi, AlNd, and AlCu.

The third metallic layer pattern comprises at least one of Ti, a Ti alloy, Ta, and a Ta alloy.

The first metallic layer pattern comprises at least one of Ti, a Ti alloy, Ta, and a Ta alloy.

The TFT further comprises a protective layer pattern arranged between the first metallic layer pattern and the second metallic layer pattern.

The protective layer pattern comprises at least one of Ti, a Ti alloy, Ta, and a Ta alloy.

The insulating layer covers the gate electrode.

The insulating layer is interposed between the gate electrode and the active layer. The active layer comprises polycrystalline silicon.

According to another aspect of the present invention, a flat panel display including a Thin Film Transistor (TFT) is provided, the TFT comprising: an active layer having a channel region and source/drain regions; a gate electrode adapted to supply a signal to the channel region; source/drain electrodes respectively connected to the source/drain regions and including at least one of Ti, Ti alloy, Ta, and Ta alloy; and an insulating layer interposed between the source/drain electrodes and the active layer and including silicon nitride.

According to yet another aspect of the present invention, a method of manufacturing a Thin Film Transistor (TFT) is provided, the method comprising: forming an active layer and a gate electrode insulated from each other by a gate insulating layer on a substrate and forming an InterLevel Dielectric (ILD) layer to cover the active layer and the gate electrode, at least one of the gate insulating layer and the ILD layer containing silicon nitride; thermally treating the substrate; forming source/drain contact holes in at least one of the gate insulating layer and the ILD layer; and forming source/drain electrodes, the source/drain electrodes being arranged on the ILD layer, contacting the active layer through the source/drain contact holes, and including at least one of Ti, a Ti alloy, Ta, and a Ta alloy.

Forming the source/drain electrodes comprises forming a first metallic layer pattern, a second metallic layer pattern, and a third metallic layer pattern arranged on the ILD layer and contacting the active layer through the source/drain contact holes.

Forming the source/drain electrodes comprises: stacking a first metallic layer on an entire surface of the substrate including the active layer exposed through the source/drain contact holes; patterning the first metallic layer to form a first metallic layer pattern; sequentially stacking a second metallic layer and a third metallic layer on the first metallic layer pattern; and patterning the second metallic layer and the third metallic layer to form a second metallic layer pattern and a third metallic layer pattern.

Forming the source/drain electrodes comprises: sequentially stacking a first metallic layer, a second metallic layer, and a third metallic layer on an entire surface of the substrate including the active layer exposed through the source/drain contact holes; and patterning the first metallic layer, the second metallic layer, and the third metallic layer to form a first metallic layer pattern, a second metallic layer pattern, and a third metallic layer pattern.

The first metallic layer pattern comprises at least one of Cr, a Cr alloy, Mo, and a Mo alloy.

The second metallic layer pattern comprises at least one of Al, AlSi, AlNd, and AlCu.

The third metallic layer pattern comprises at least one of Ti, a Ti alloy, Ta, and a Ta alloy.

The first metallic layer pattern comprises at least one of Ti, a Ti alloy, Ta, and a Ta alloy.

The method further comprises forming a protective layer pattern on a first metallic layer pattern before forming the second metallic layer pattern.

According to still another aspect of the present invention, a method of manufacturing a flat panel display is provided, the method comprising: manufacturing a Thin Film Transistor (TFT) including: forming an active layer and a gate electrode insulated from each other by a gate insulating layer on a substrate and forming an InterLevel Dielectric (ILD) layer to cover the active layer and the gate electrode, at least one of the gate insulating layer and the ILD layer containing silicon nitride; thermally treating the substrate; forming source/drain contact holes in at least one of the gate insulating layer and the ILD layer; and forming source/drain electrodes, the source/drain electrodes being arranged on the ILD layer, contacting the active layer through the source/drain contact holes, and including at least one of Ti, a Ti alloy, Ta, and a Ta alloy; forming an insulating layer to cover the TFT; and forming a pixel electrode connected to the source/drain electrodes of the TFT on the insulating layer.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Figure 1:
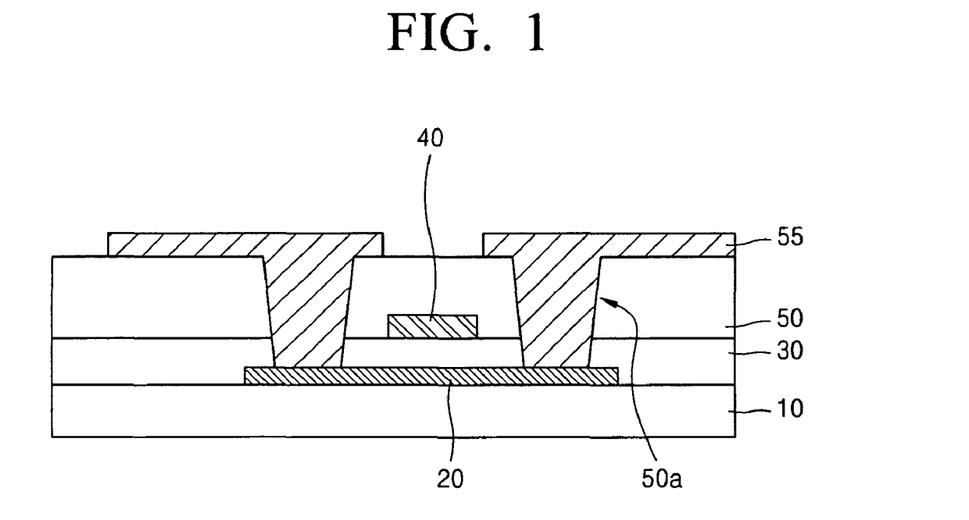
FIG. 1 is a cross-sectional view of a Thin Film Transistor (TFT) of a flat panel display.

FIG. 1 is a cross-sectional view of a TFT of a flat panel display. Referring to FIG. 1, an active layer 20 comprised of a semiconductor is formed on a substrate 10. A gate insulating layer 30 is formed on the active layer 20 to cover the active layer 20. A gate electrode 40 is formed on the gate insulating layer 30. The gate electrode 40 is covered with an InterLevel Dielectric (ILD) layer 50, and contact holes 50a through which source/drain regions of the active layer 20 are exposed are formed in the gate insulating layer 30 and the ILD layer 50. Source/drain electrodes 55 are formed on the ILD layer 50. The source/drain electrodes 55 are connected to the source/drain regions of the active layer 20 through the contact holes 50a. When forming the source/drain electrodes 55, a variety of signal interconnections (not shown) of the flat panel display can be formed together.

The source/drain electrodes 55 and the signal interconnections can be formed of molybdenum or molybdenum alloy. Since molybdenum has a high specific resistance, the resistance of the source/drain electrodes 55 and the signal interconnection is increased, resulting in a signal delay in a flat panel display including the TFT. This signal delay causes the lowering of the picture quality of the flat panel display.

In order to solve these problems, the source/drain electrodes 55 and the signal interconnection have been formed of a double layer comprising a molybdenum layer and an aluminum layer having a low resistance formed on the molybdenum layer. However, one of the source/drain electrodes 55 is in contact with an Indium Tin Oxide (ITO) layer of a pixel electrode (not shown). Since an oxide layer is formed between the aluminum layer and the ITO layer, the contact resistance between the pixel electrode and the source/drain electrodes 55 contacting the pixel electrode is increased.

The present invention will now be described more fully with reference to the accompanying drawings in which exemplary embodiments of the present invention are shown. The present invention can, however, be embodied in many different forms and should not be construed as being limited to the embodiments set forth herein. Rather, these embodiments are provided so that this disclosure will be thorough and complete, and will fully convey the scope of the present invention to those skilled in the art.

It will be understood that when a layer is referred to as being on another layer or "on" a semiconductor substrate, it can be directly on the other layer or on the semiconductor substrate, or intervening layers can also be present. To facilitate understanding, identical reference numerals have been used, where possible, to designate identical elements that are common among the figures.

Figure 2:
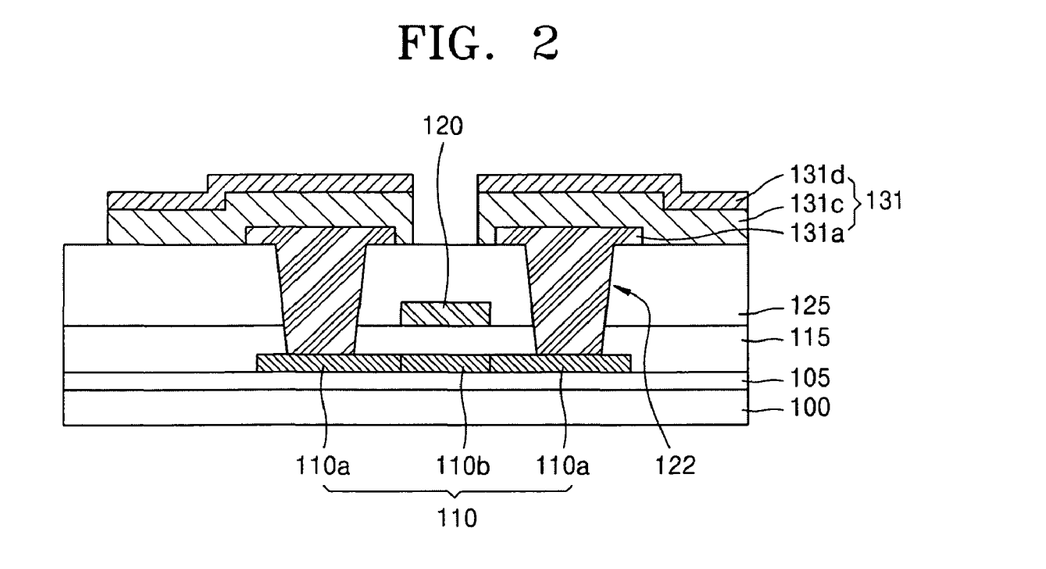
FIG. 2 is a cross-sectional view of a TFT according to an embodiment of the present invention.

FIG. 2 is a cross-sectional view of a Thin Film Transistor (TFT) according to an embodiment of the present invention. Referring to FIG. 2, the TFT is formed on a substrate 100. A glass, plastic, or metal substrate can be used as the substrate 100. A buffer layer 105 is formed on the substrate 100. The buffer layer 105 serves to protect a TFT formed in subsequent processes from impurities such as alkaline ions emitted from the substrate 100 and can be formed of silicon oxide or silicon nitride.

An amorphous silicon layer is stacked on the buffer layer 105, and a polycrystalline silicon layer is formed by crystallizing the amorphous silicon layer. The amorphous silicon layer can be crystallized using a method such as Excimer Laser Annealing (ELA), Sequential Lateral Solidification (SLS), Metal Induced Crystallization (MIC), or Metal Induced Lateral Crystallization (MILC).

The polycrystalline silicon layer is patterned so that an active layer 110 is formed on the substrate 100. Then, a gate insulating layer 115 is formed on the entire surface of the substrate 100 including the active layer 110. A gate electrode material is stacked on the gate insulating layer 115 and patterned so that a gate electrode 120 is formed to correspond to a predetermined portion of the active layer 110, for example, a channel region 110b of the active layer 110. The gate electrode material can be at least one of Al, an Al alloy, Mo, and a Mo alloy. Specifically, a molybdenum-tungsten alloy can be used as the gate electrode material.

Ions are doped on the active layer 110 using the gate electrode 120 so that source/drain regions 110a are formed in the active layer 110 and simultaneously, the channel region 110b interposed between the source/drain regions 110a is defined. Next, an InterLevel Dielectric (ILD) layer 125 is formed to cover the gate electrode 120. In this case, the stack order of the gate electrode 120 and the active layer 110 can be opposite.

After the ILD layer 125 is formed, source/drain contact holes 122 are formed to perforate the ILD layer 125 and the gate insulating layer 115 so that the source/drain regions 110a of the active layer 110 are exposed through the source/drain contact holes 122.

Source/drain electrodes 131 including at least one of Ti, a Ti alloy, Ta, and a Ta alloy are formed through the source/drain contact holes 122.

In the embodiment of FIG. 2, the source/drain electrodes 131 include a first metallic layer pattern 131a, a second metallic layer pattern 131c, and a third metallic layer pattern 131d, which are sequentially stacked in the direction of the active layer 110.

The first metallic layer pattern 131a can be formed of Cr, a Cr alloy, Mo, and a Mo alloy, or Ti or Ta as a heat resistant metal.

The second metallic layer pattern 131c can be formed of a metallic layer including Al. The Al-based metals can be Al, AlSi, AlNd, or AlCu. AlSi containing a predetermined ratio of silicon can be used in forming the second metallic layer pattern 131c.

The third metallic layer pattern 131d can be formed of Ti or Ta.

The first metallic layer pattern 131a can be formed to a thickness at which the second metallic layer pattern 131c formed of Al-based material stacked on the first metallic layer pattern 131a is prevented from directly contacting a surface protrusion of the polycrystalline silicon layer of the active layer 110. The thickness of the first metallic layer pattern 131a can be about 500-1500 Å.

When the first metallic layer pattern 131a is formed of Cr, a Cr alloy, MO, or a Mo alloy, the first metallic layer pattern 131a has a high thermal stability in a subsequent thermal treatment processes. In addition, the first metallic layer pattern 131a has a higher corrosion resistance than that of the second metallic layer pattern 131c formed of Al-based metal, and the source/drain electrodes 131, the active layer 110, and the insulating layers 115 and 125 contact one another smoothly.

When the first metallic layer pattern 131a is formed of Ti or Ta, the Al-based metal used in forming the second metallic layer pattern 130c is prevented from directly contacting the active layer 110, the silicon of the active layer 110 being diffused into the second metallic layer pattern 130c formed of Al-based metal to cause defects. In addition, Ti or Ta serves to prevent defects such as hillock of the second metallic layer pattern 130c formed of Al-based material.

Al-based metal is used in forming the second metallic layer pattern 131c so that the electrical conductivity of the source/drain electrodes 131 can be improved and the interconnection resistance can be reduced.

In addition, when the second metallic layer pattern 131c is formed of Al-based metal and when the second metallic layer pattern 131c directly contacts a pixel electrode of a flat panel display device, an oxide layer can be formed as described above. In order to prevent formation of the oxide layer, Ti or Ta that serves to prevent defects such as hillock of Al-based metal is used in forming the third metallic layer pattern 131d.

The first through third metallic layer patterns 131a, 131c, and 131d are formed in such a way that the first metallic layer pattern 131a is first formed in the source/drain contact holes 122, metals used in forming the second and third metallic layer patterns 131c and 131d are sequentially stacked on the first metallic layer pattern 131a and are patterned simultaneously, thereby forming the second and third metallic layer patterns 131c and 131d.

However, the first metallic layer pattern 131a, the second metallic layer pattern 131c, and the third metallic layer pattern 131d are sequentially stacked and then patterned altogether, thereby forming the first through third metallic layer patterns 131a, 131c, and 131d.

In the embodiment shown in FIG. 2, at least one of the gate insulating layer 115 and the ILD layer 125 can include silicon nitride. Silicon nitride contains a large amount of hydrogen during its formation process. The hydrogen contained in silicon nitride can be diffused into the active layer 110 using a thermal treatment process. The hydrogen diffused into the active layer 110 prevents dangling bonds in the active layer 110.

However, as described above, since Ti or Ta contained in the source/drain electrodes 131 has a very good reaction with hydrogen contained in the silicon nitride of the gate insulating layer 115 and/or the ILD layer 125, the diffusion of hydrogen is prevented and a reduction in hydrogenation in the active layer 110 occurs. Thus, in the embodiment of FIG. 2, in order to compensate for this reduction in hydrogenation, the gate insulating layer 115 and/or the ILD layer 125 containing silicon nitride is preheated before the source/drain electrodes 131 containing Ti or Ta etc. and the source/drain electrodes 131 are formed.

This thermal treatment process is performed at about 380 degrees C. Owing to the thermal treatment process, ions doped in the source/drain regions 110a of the active layer 110 are activated, and hydrogen contained in the gate insulating layer 115 and/or the ILD layer 125 is diffused into the active layer 110.

Figure 3:
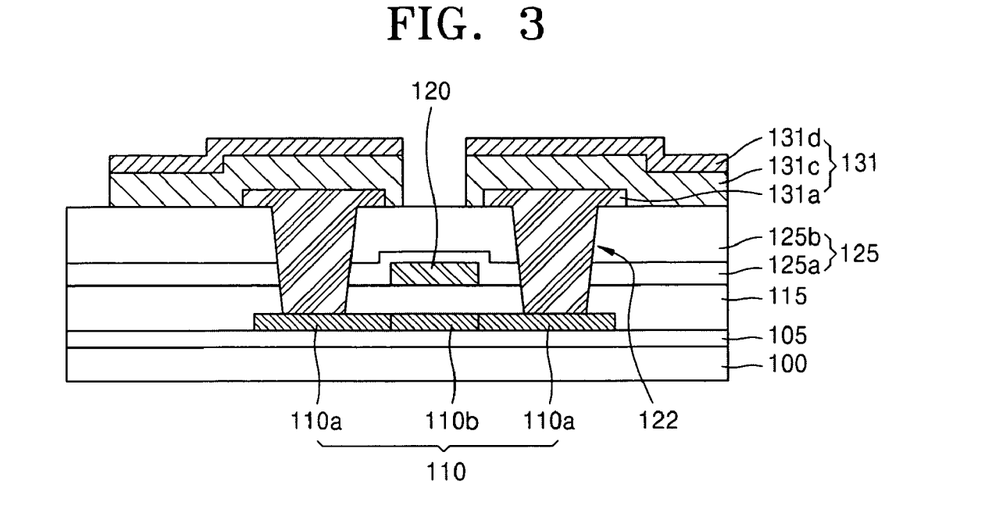
FIG. 3 is a cross-sectional view of a TFT according to another embodiment of the present invention.

In another embodiment shown in FIG. 3, the ILD layer 125 is formed of a double layer comprised of a first ILD layer 125a and a second ILD layer 125b. Silicon nitride can be contained in the first ILD layer 125a distant from the source/drain electrodes 131. A thermal treatment is performed to compensate for hydrogenation before the source/drain electrodes 131 are formed. In FIG. 3, the ILD layer 125 is only a double layer but the present invention is not limited to this. The present embodiment can also include an ILD layer 125 having a multi-layer structure. A silicon nitride layer can be formed on a side closest to the active layer 110. This double or multi-layer structure can also be applied to the gate insulating layer 115.

Other features of the embodiment shown in FIG. 3 are the same as those of the embodiment of FIG. 2 described above, and accordingly, detailed descriptions thereof have been omitted.

Figure 4:
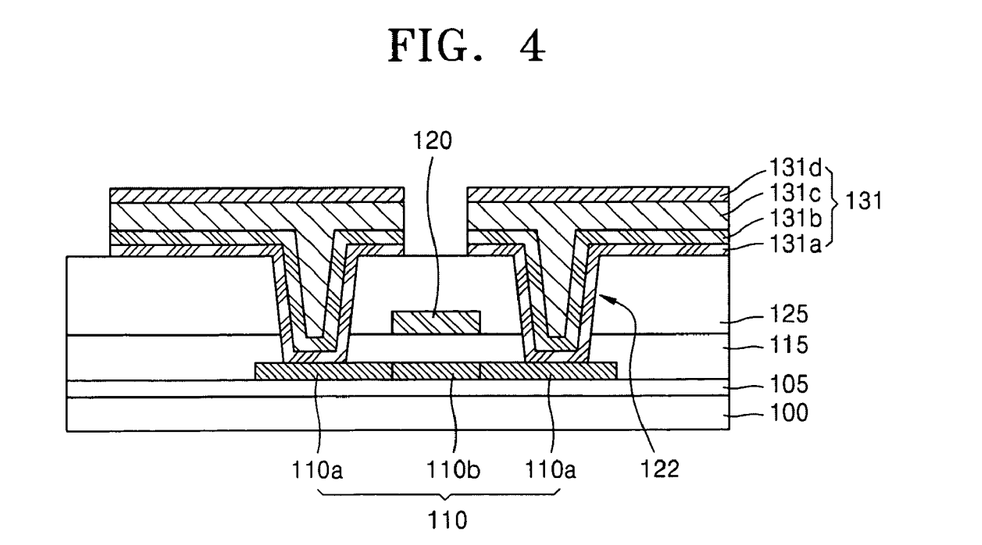
FIG. 4 is a cross-sectional view of a TFT according to still another embodiment of the present invention.

FIG. 4 is a cross-sectional view of a TFT according still another embodiment of the present invention. Referring to FIG. 4, a protective layer pattern 131b is formed between the first metallic layer pattern 131a and the second metallic layer pattern 131c.

The first metallic layer pattern 131a can include at least one of Cr, a Cr alloy, Mo, and a Mo alloy, and the protective layer pattern 131b can include Ti or Ta.

The reason the layer has a four-layer structure is that when the first metallic layer pattern 131a is not sufficiently thick, due to the surface roughness of the active layer 110, the active layer 110 and the second metallic layer pattern 131c can contact each other.

When a polycrystalline silicon layer is formed by crystallizing the active layer using a laser, that is, using ELA or SLS, the polycrystalline silicon layer can have a rough surface caused by surface protrusions. Since the rough surface can perforate the first metallic layer pattern 131a and contact the second metallic layer pattern 131c to cause damage, a protective layer 313b is formed to prevent this damage.

In the embodiment of FIG. 4, silicon nitride is formed on the gate insulating layer 115 and/or the ILD layer 125. In order to prevent a reduction in hydrogenation in the active layer 110 caused by Ti or Ta of the source/drain electrodes 131, the substrate is thermally treated before the source/drain electrodes 131 are formed.

Other features of the embodiment of FIG. 4 are the same as those of the embodiments of FIGS. 2 and 3 described above, and accordingly, detailed descriptions thereof have been omitted.

Figure 5:
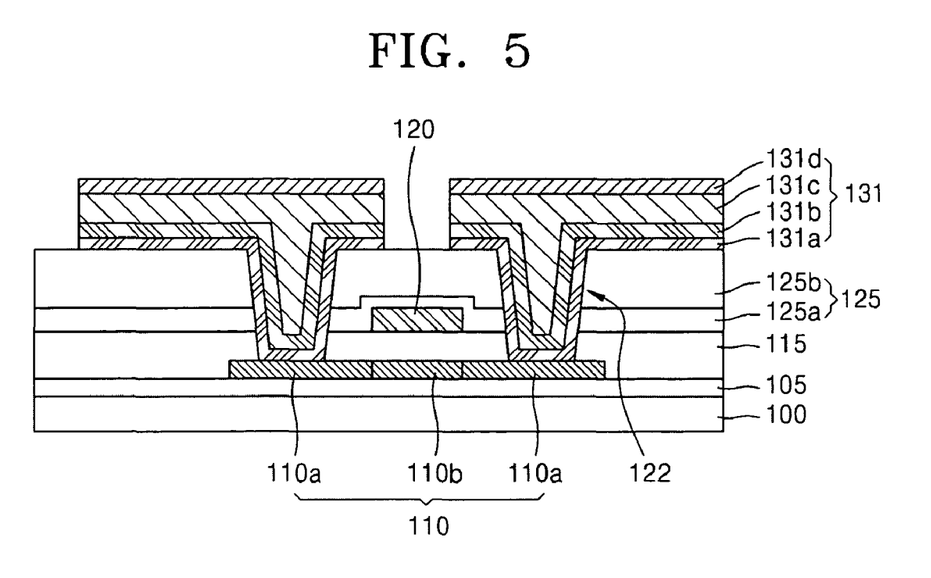
FIG. 5 is a cross-sectional view of a TFT according to yet another embodiment of the present invention.

FIG. 5 is a cross-sectional view of a TFT according to yet another embodiment of the present invention. As in the embodiment of FIG. 5, the ILD layer 125 is formed of a double layer comprising the first ILD layer 125a and the second ILD layer 125b. Silicon nitride can be contained in the first ILD layer 125a distant from the source/drain electrodes 131. Thermal treatment is performed to compensate for hydrogenation before the source/drain electrodes 131 are formed.

In FIG. 5, the ILD layer 125 is only a double layer. However, the present invention is not limited to this. The present embodiment can also include an ILD layer 125 having a multi-layer structure. A silicon nitride layer can be formed on a side closest to the active layer 110. This double or multi-layer structure can also be applied to the gate insulating layer 115.

Other features of the embodiment of FIG. 5 are the same as those of the embodiments of FIG. 2 through 4 described above, and accordingly, detailed descriptions thereof have been omitted.

The above-described TFTs can be applied to an active matrix Organic Light-Emitting Diode (OLED) or a Liquid Crystal Display (LCD).

Figure 6:
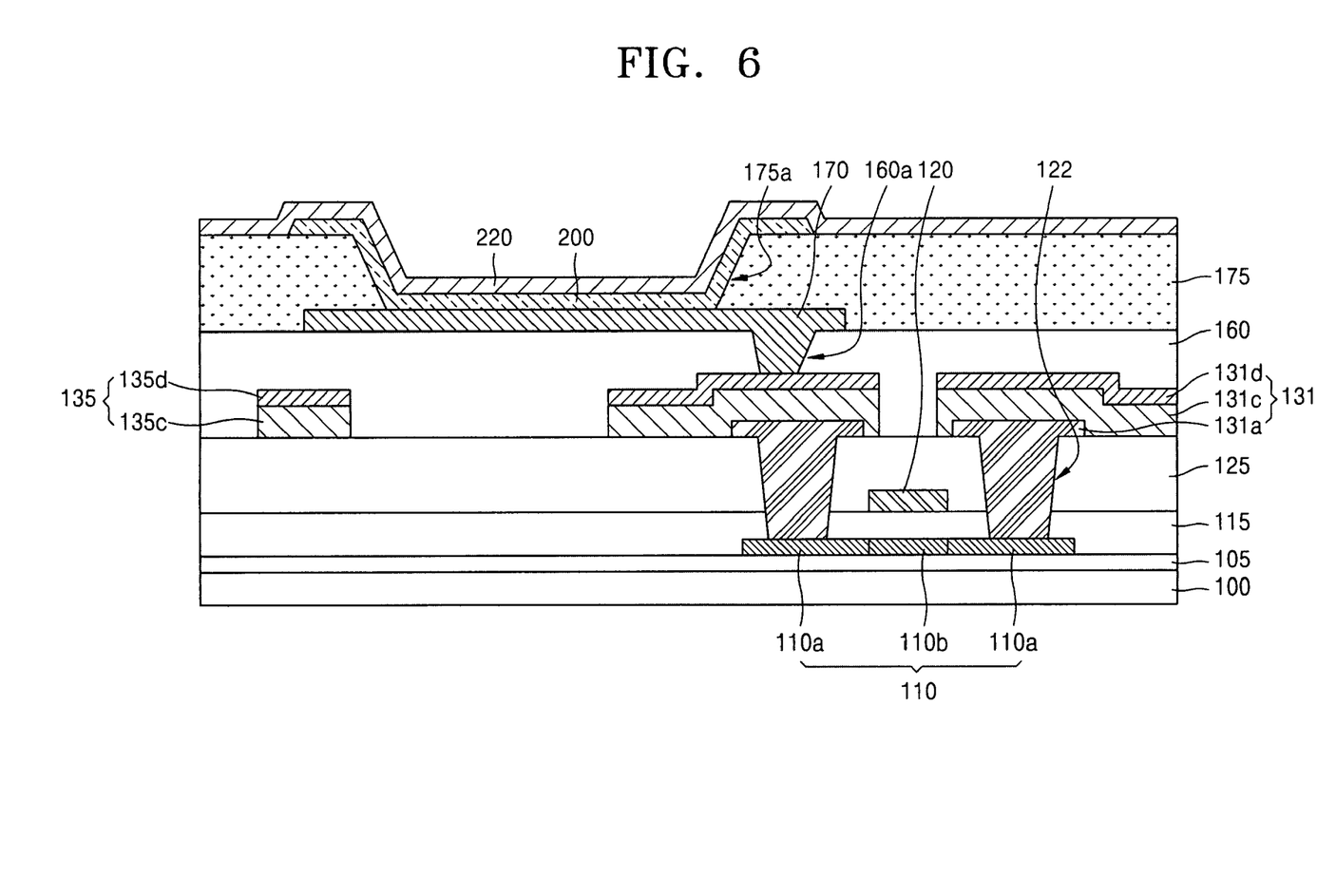
FIG. 6 is a cross-sectional view of an Organic Light-Emitting Diode (OLED) including the TFT of FIG. 2.

FIG. 6 is a view of an OLED having the TFT of FIG. 2, in which subpixels disposed in an emission region form an image.

A plurality of subpixels are disposed in the emission region. In a full color OLED, Red (R), Green (G), and Blue (B) color subpixels are arranged in a variety of patterns such as lines, a mosaic, and a lattice, etc., to form pixels. In addition, the OLED can not only be a full color flat panel display but can also be a monochrome flat panel display.

The present invention is not limited to the number and arrangement of the TFTs of FIGS. 2 through 5, but can rather be a variety of numbers and arrangements of the TFTs.

As shown in FIG. 6, the TFT of FIG. 2 is formed on the substrate 100. The TFT is the same as that in the embodiment shown in FIG. 2, and accordingly, a description thereof has been omitted.

As shown in FIG. 6, when the source/drain electrodes 131 are formed on the ILD layer 125, a separate interconnection 135 can be formed. In the embodiment of FIG. 6, when the first metallic layer pattern 131a of the source/drain electrodes 131 is formed, the interconnection 135 is formed when the second and third metallic layer patterns 131c and 131d are formed, without forming an interconnection, and the interconnection 135 can comprise a second metallic interconnection 135c formed of the same material as the material used in forming the second metallic layer pattern 131c and a third metallic interconnection 135d formed of the same material as the material used in forming the third metallic layer pattern 131d. In the present invention, the interconnection 135 is not limited to this. When the first metallic layer pattern 131a of the source/drain electrodes 131 is patterned simultaneously with the second and third metallic layer patterns 131c and 131d and formed, the interconnection 135 can further comprise a first metallic interconnection (not shown) formed of the same material as the material used in forming the first metallic layer pattern 131a.

After the interconnection 135 and the source/drain electrodes 131 are formed in this way, a passivation layer 160 is formed to cover the interconnection 135 and the source/drain electrodes 131. The passivation layer 160 can be formed of an inorganic material such as silicon oxide and silicon nitride etc. or an organic material such as acryl, polyimide, and BCB etc., or a compound thereof. After a via hole 160a is formed in the passivation layer 160, a pixel electrode 170 is formed on the passivation layer 160 to contact one of the source/drain electrodes 131. A pixel definition layer 175 is formed of an organic material to cover the pixel electrode 170. After a predetermined opening 175a is formed in the pixel definition layer 175, an organic layer 200 is formed in a region defined by at least the opening 175a. The organic layer 200 includes an emission layer. An opposite electrode 220 is formed on the organic layer 200 to cover all pixels. The present invention is not limited to the above-described structure but rather, the OLED can have a variety of structures.

The OLED displays predetermined image information by emitting red, green, and blue light according to the flow of current. The OLED comprises the pixel electrode 170 connected to one of the source/drain electrodes 131 of the TFT, the opposite electrode 220 formed to cover all of the pixels, and the organic layer 200, which is disposed between the pixel electrode 170 and the opposite electrode 220, emitting light.

The pixel electrode 175 and the opposite electrode 220 are insulated from each other by the organic layer 200, and voltages of difference polarities are supplied to the organic film 200 so that light can be emitted from the organic layer 200.

The organic layer 200 can be a low or high molecular organic layer. When a low molecular organic layer is used as the organic layer 200, the low molecular layer is formed by stacking a Hole Injection Layer (HIL), a Hole Transport Layer (HTL), an EMssion Layer (EML), an Electron Transport Layer (ETL), and an Electron Injection Layer (EIL) in a single or composite structure, and a variety of organic materials such as copper phthalocyanine (CuPc), N,N'-Di(naphthalene-1-yl)-N,N'-diphenyl-benzidine (NPB), and tris-8-hydroxyquinoline aluminum (Alq3) can be used for the lower molecular organic layer. These low molecular organic layers are formed by vapor deposition.

When a high molecular organic layer is used as the organic layer 200, the high molecular organic layer can generally have a structure in which the HTL and the EML are formed. In this case, PEDOT is used for the HTL, and high molecular organic materials such as Poly-Phenylenevinylene and Poly-fluorene are used for the EML. These high molecular organic layers are formed by screen printing or ink-jet printing, etc.

The present invention is not limited to the above-described organic layers but rather, a variety of embodiments can also be applied.

The pixel electrode 170 serves as an anode, and the opposite electrode 220 serves as a cathode. Polarities of the pixel electrode 170 and the opposite electrode 220 can be reversed.

The pixel electrode 170 can be a transparent electrode or a reflection electrode. The transparent electrode can be formed of ITO, IZO, ZnO or $In_2O_3$, and after a reflection layer is formed of Ag, Mg, Al, Pt, Pd, Au, Ni, Nd, Ir, Cr or a compound thereof, and the reflection electrode can be formed on the reflection layer, the reflection electrode being formed of ITO, IZO, ZnO or $In_2O_3$.

The opposite electrode 220 can also be a transparent electrode or a reflection electrode. When the transparent electrode is used as the opposite electrode 220, since the opposite electrode 220 is used as a cathode, after metals having a small work function, such as Li, Ca, LiF/Ca, LiF/Al, Al, Mg, or a compound thereof are deposited on the organic film 190, an auxiliary electrode layer or a bus electrode line can be formed of a material used in forming the transparent electrode, such as ITO, IZO, ZnO or $In_2O_3$. The reflection electrode is formed by depositing metals such as Li, Ca, LiF/Ca, LiF/Al, Al, Mg, or a compound thereof on an entire surface of the OLED.

On the other hand, in an LCD, a lower alignment layer (not shown) covering the pixel electrode 170 is formed so that a lower substrate of the LCD can be manufactured.

The pixel electrode 170 contacts one of the source/drain electrodes 131 through the via hole 160a. The pixel electrode 170 is prevented from contacting the third metallic layer pattern 131d formed of Ti or Ta and directly contacting the second metallic layer pattern 131c formed of Al-based metal.

The TFT is used not only to contact a pixel electrode in a pixel but also as a switching TFT, a compensation circuit TFT, or a TFT of a driver circuit outside of an emission region.

Figure 7:
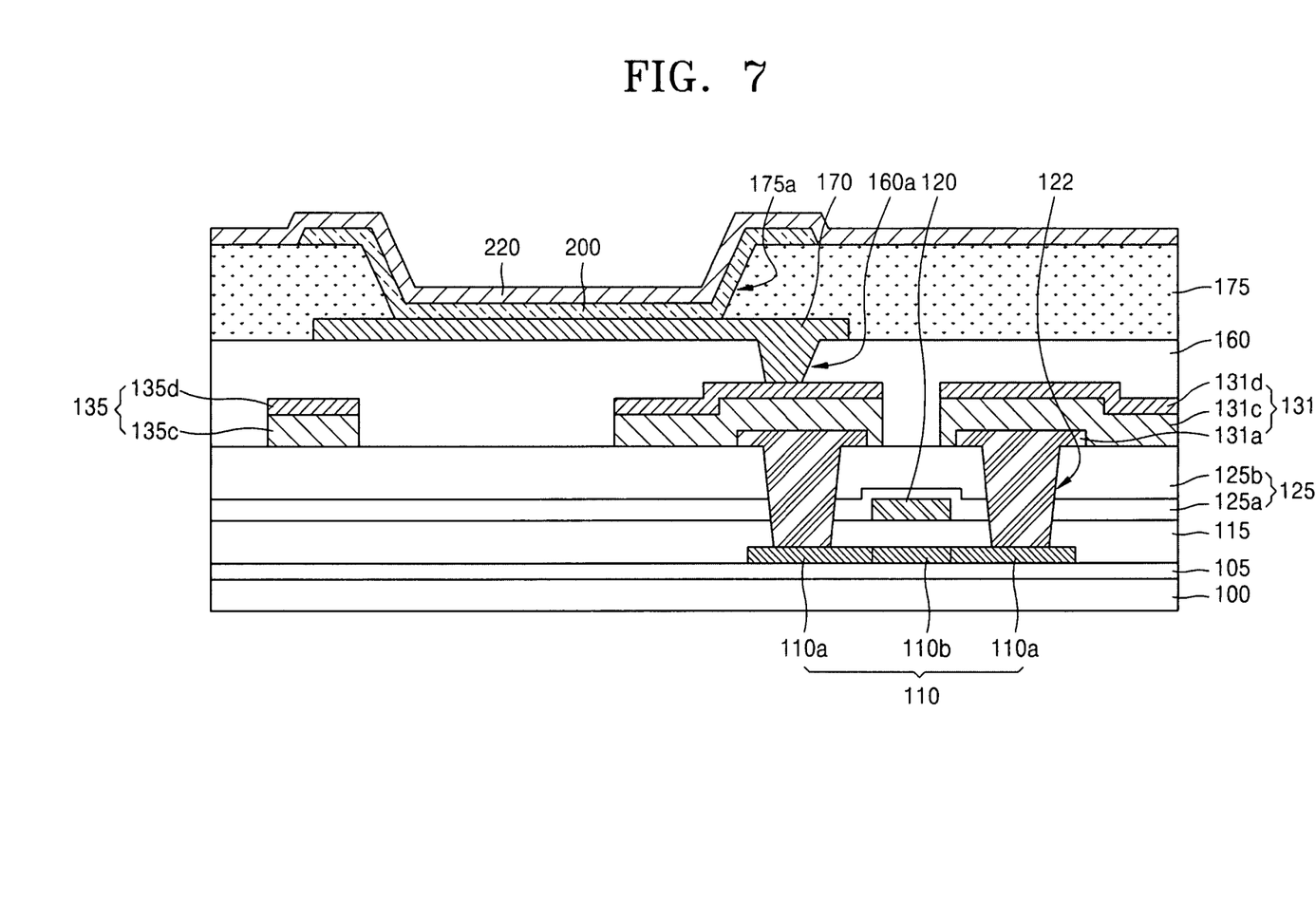
FIG. 7 is a cross-sectional view of an OLED including the TFT of FIG. 3.

FIG. 7 is a view of an OLED having the TFT of FIG. 3. The structure of the ILD layer 125 of FIG. 7 is different from the structure of FIG. 6. The structure of the ILD layer 125 has been described in the above-described embodiment of FIG. 3, and accordingly, a detailed description thereof has been omitted.

Figure 8:
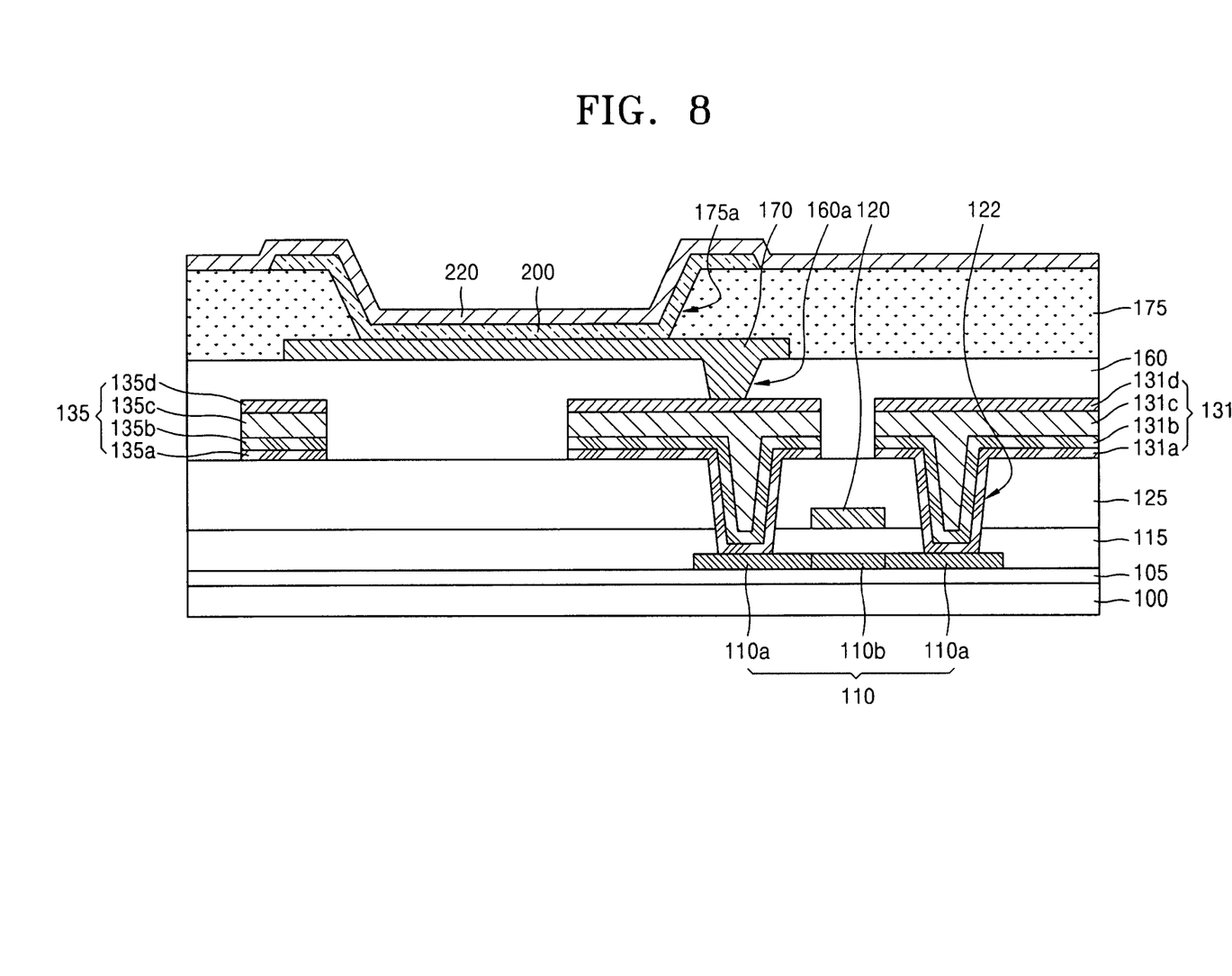
FIG. 8 is a cross-sectional view of an OLED including the TFT of FIG. 4.

FIG. 8 is a view of an OLED having the TFT of FIG. 4. The structure of the source/drain electrodes 131 of FIG. 8 is different from the structure of FIG. 6. The structure of the source/drain electrodes 131 has been described in the above-described embodiment of FIG. 4, and accordingly, detailed descriptions thereof have been omitted.

The interconnection 135 can have a structure in which a first metallic layer interconnection 135a of the same material as the material used in forming the first metallic layer pattern 131a, a protective layer interconnection 135b of the same material as the material used in forming the protective layer pattern 131b, a second metallic layer interconnection 135c of the same material as the material used in forming the second metallic layer pattern 131c, and a third metallic layer interconnection 135d of the same material as the material used in forming the third metallic layer pattern 131d are sequentially formed.

Figure 9:
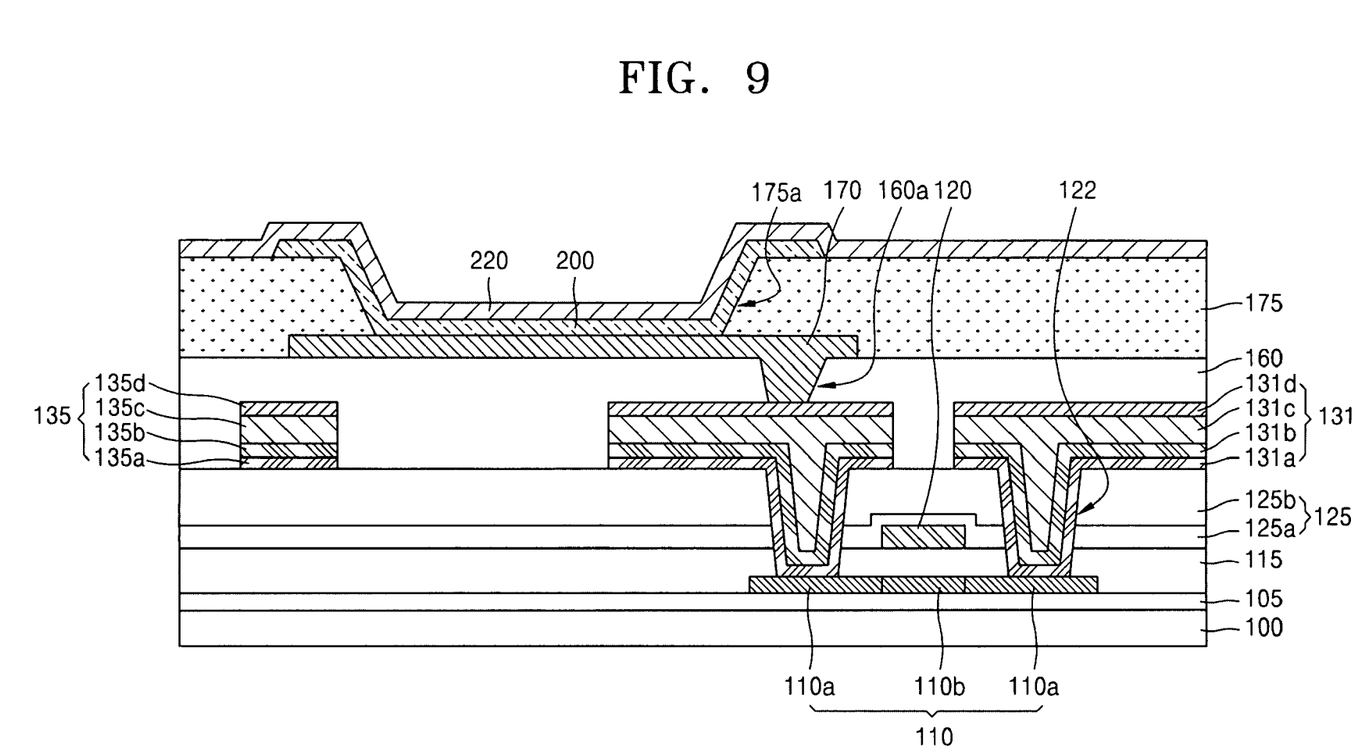
FIG. 9 is a cross-sectional view of an OLED including the TFT of FIG. 5.

FIG. 9 is a view of an OLED having the TFT of FIG. 5. The structure of the ILD layer 125 of FIG. 9 is different from the structure of FIG. 8. The structure of the ILD layer 125 has been described in the above-described embodiment of FIG. 5, and accordingly, a detailed description thereof has been omitted.

As described above, the present invention has the following effects. First, a TFT which reduces interconnection resistance of source/drain electrodes, prevents contamination from an active layer, reduces contact resistance between a pixel electrode and the source/drain electrodes, and a flat panel display device having the TFT can be obtained. Second, a TFT which smoothly supplies hydrogen to the active layer and has high mobility, on-current characteristics, and threshold voltage characteristics, and a flat panel display device having the TFT can be obtained.

While the present invention has been particularly shown and described with reference to exemplary embodiments thereof, it will be understood by those of ordinary skill in the art that various modifications in form and detail can be made therein without departing from the spirit and scope of the present invention as defined by the following claims.

What is claimed is:

1. A method of manufacturing a Thin Film Transistor (TFT), the method comprising:

forming an active layer and a gate electrode insulated from each other by a gate insulating layer on a substrate and forming an InterLevel Dielectric (ILD) layer to cover the active layer and the gate electrode, at least one of the gate insulating layer and the ILD layer containing silicon nitride;

thermally treating the ILD layer;

forming source/drain contact holes in at least one of the gate insulating layer and the ILD layer; and forming source/drain electrodes, the source/drain electrodes being arranged on the ILD layer, contacting the active layer through the source/drain contact holes, wherein forming the source/drain electrodes comprises:

forming a first metallic layer pattern arranged on the ILD layer and contacting the active layer through the source/drain contact holes, said first metallic layer formed of Cr, Cr alloy, Mo, or Mo alloy;

forming a second metallic layer pattern on said first metallic layer and formed of Al, AlSi, AlNd, or AlCu; and forming a third metallic layer pattern on said second metallic layer and formed of Ti, Ti alloy, Ta, or Ta alloy, wherein the active layer comprises a poly silicon, wherein the thermally treating of the ILD laver must be performed prior to forming the source and drain electrodes.

2. The method of claim 1, further comprising forming a protective layer pattern on a first metallic layer pattern before forming the second metallic layer pattern.

3. A method of manufacturing a flat panel display, the method comprising: manufacturing a Thin Film Transistor (TFT) including:

forming an active layer and a gate electrode insulated from each other by a gate insulating layer on a substrate and forming an InterLevel Dielectric (ILD) layer to cover the active layer and the gate electrode, at least one of the gate insulating layer and the ILD layer containing silicon nitride;

thermally treating the ILD layer;

forming source/drain contact holes in at least one of the gate insulating layer and the ILD layer; and forming source/drain electrodes, the source/drain electrodes being arranged on the ILD layer, contacting the active layer through the source/drain contact holes, forming an insulating layer to cover the TFT; and forming a pixel electrode connected to the source/drain electrodes of the TFT on the insulating layer, wherein forming the source/drain electrodes comprises:

forming a first metallic layer pattern arranged on the ILD layer and contacting the active layer through the source/drain contact holes, said first metallic layer formed of Cr, Cr alloy, Mo, or Mo alloy;

forming a second metallic layer pattern on said first metallic layer and formed of Al, AlSi, AlNd, or AlCu; and forming a third metallic layer pattern on said second metallic layer and formed of Ti, Ti alloy, Ta, or Ta alloy, wherein the active layer comprises a poly silicon, wherein the thermally treating of the ILD laver must be performed prior to forming the source and drain electrodes.

* * * * *